United States Patent
Yamazaki et al.

(10) Patent No.: US 11,764,183 B2
(45) Date of Patent: Sep. 19, 2023

(54) JOINT STRUCTURE, SEMICONDUCTOR DEVICE, AND METHOD OF MANUFACTURING SAME

(71) Applicant: Mitsubishi Electric Corporation, Tokyo (JP)

(72) Inventors: Koji Yamazaki, Tokyo (JP); Yoshio Tamura, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 391 days.

(21) Appl. No.: 17/281,984

(22) PCT Filed: Nov. 8, 2018

(86) PCT No.: PCT/JP2018/041502
§ 371 (c)(1),
(2) Date: Apr. 1, 2021

(87) PCT Pub. No.: WO2020/095411
PCT Pub. Date: May 14, 2020

(65) Prior Publication Data
US 2021/0343676 A1   Nov. 4, 2021

(51) Int. Cl.
*H01L 23/00* (2006.01)
(52) U.S. Cl.
CPC .............. *H01L 24/29* (2013.01); *H01L 24/32* (2013.01); *H01L 24/83* (2013.01);
(Continued)
(58) Field of Classification Search
None
See application file for complete search history.

(56) References Cited

U.S. PATENT DOCUMENTS

| | | |
|---|---|---|
| 2002/0100986 A1 | 8/2002 | Soga et al. |
| 2002/0114726 A1 | 8/2002 | Soga et al. |

(Continued)

FOREIGN PATENT DOCUMENTS

| | | | | |
|---|---|---|---|---|
| JP | 2002-261105 A | 9/2002 | | |
| JP | 2005229113 A | * 8/2005 | ............ | B23K 35/26 |

(Continued)

OTHER PUBLICATIONS

Sang-jin et al. "Newly Designed Cu/Cu10Sn3 Core/Shell Nanoparticles for Liquid Phase-Photonic Sintered Copper Electrodes: Large Area, Low-Cost Transparent Flexible Electronics", Jun. 16, 2016, American Chemical Society, pp. 4714-4723 (Year: 2016 ).*

(Continued)

*Primary Examiner* — Telly D Green
(74) *Attorney, Agent, or Firm* — XSENSUS LLP

(57) ABSTRACT

Provided is a joint structure interposed between a semiconductor element and a substrate, the joint structure including: a Sn phase; Cu alloy particles containing P in an amount of 1 mass % or more and less than 7 mass %; and Ag particles, wherein the Cu alloy particles are each coated with a $Cu_6Sn_5$ layer, wherein the Ag particles are each coated with a $Ag_3Sn$ layer, wherein the Cu alloy particles and the Ag particles are at least partially bonded to each other through a $Cu_{10}Sn_3$ phase, wherein a total of addition amounts of the Cu alloy particles and the Ag particles is 25 mass % or more and less than 65 mass % with respect to the joint structure, and wherein a mass ratio of the addition amount of the Ag particles to the addition amount of the Cu alloy particles is 0.2 or more and less than 1.2.

5 Claims, 5 Drawing Sheets

(52) U.S. Cl.
CPC .............. *H01L 2224/29111* (2013.01); *H01L 2224/29139* (2013.01); *H01L 2224/29147* (2013.01); *H01L 2224/29611* (2013.01); *H01L 2224/29639* (2013.01); *H01L 2224/29647* (2013.01); *H01L 2224/32225* (2013.01); *H01L 2224/83815* (2013.01); *H01L 2924/01015* (2013.01)

(56) References Cited

U.S. PATENT DOCUMENTS

| | | |
|---|---|---|
| 2002/0171157 A1 | 11/2002 | Soga et al. |
| 2007/0031279 A1 | 2/2007 | Soga et al. |
| 2009/0288862 A1* | 11/2009 | Tamura .................. H05K 3/244 156/60 |
| 2016/0348260 A1* | 12/2016 | Takahashi .............. C25D 5/505 |

FOREIGN PATENT DOCUMENTS

| | | | |
|---|---|---|---|
| JP | 2014-199852 A | 10/2014 | |
| JP | 2016172912 A * | 9/2016 | |
| WO | WO-2013024829 A1 * | 2/2013 | ........... B23K 1/0016 |

OTHER PUBLICATIONS

Written Search Report (English translation) of PCT/JP2018/041502 filed May 11, 2021 (Year: 2021).*
International Search Report and Written Opinion dated Dec. 11, 2018, received for PCT Application PCT/JP2018/041502, Filed on Nov. 8, 2018, 8 pages including English Translation.

* cited by examiner

JOINT STRUCTURE, SEMICONDUCTOR DEVICE, AND METHOD OF MANUFACTURING SAME

CROSS-REFERENCE TO RELATED APPLICATION

The present application is based on PCT filing PCT/JP2018/041502, filed Nov. 8, 2018, the entire contents of which is incorporated herein by reference.

TECHNICAL FIELD

The present invention relates to a joint structure, a semiconductor device, and a method of manufacturing the same.

BACKGROUND ART

In recent years, there is an increasing demand for reliability of semiconductor devices. In particular, there is a large difference in thermal expansion coefficient between a semiconductor element and a circuit board, and hence it is required to improve the reliability of a joint portion interposed therebetween. As the semiconductor element, elements made of silicon (Si), gallium arsenide (GaAs), and the like as base materials have hitherto been used in many cases, and the operation temperature thereof is from 100° C. to 125° C. A joint material to be used for joining those semiconductor elements to the circuit board is required to have a high melting point adaptable to multi-step joining, crack resistance to repeated thermal stress in association with start/stop, and contamination resistance of a semiconductor device. In response to those requirements, 95Pb-5Sn (mass %) is used as a joint material in a semiconductor device using a semiconductor element made of Si as a base material. In addition, in a semiconductor device using a semiconductor element made of gallium arsenide as a base material, 80Au-20Sn (mass %) is used as a joint material. However, 95Pb-5Sn, which contains a large amount of harmful lead (Pb), has a problem from the viewpoint of reducing an environmental load. In addition, 80Au-20Sn, which contains a large amount of noble metal, has problems in terms of the soaring price of noble metal and the reserves thereof. Therefore, there has been a strong demand for a joint material that serves as an alternative to those joint materials.

On the other hand, from the viewpoint of energy saving, as a next-generation semiconductor device, a semiconductor device using a semiconductor element made of silicon carbide (SiC) or gallium nitride (GaN) as a base material is being actively developed. From the viewpoint of reducing power loss, the operation temperature of those semiconductor devices is set to 175° C. or more, and is said to be increased also to 300° C. in the future. Therefore, it is required that the joint portion interposed between the semiconductor element and the circuit board not be cracked even when the semiconductor device is operated at a higher temperature.

Therefore, it is required to improve the crack resistance of the joint portion when the semiconductor device is operated at a high temperature while the problem of the conventional joint material containing lead or noble metal is solved.

In view of the foregoing, in Patent Document 1, as a method of joining a semiconductor element and a substrate in a semiconductor device, there is disclosed a joining method including the steps of: applying a joint material containing Cu particles and Sn particles onto a joint surface of the semiconductor element or the substrate; bringing the joint surface of the semiconductor element and the joint surface of the substrate into contact with each other with the joint material interposed therebetween; and heating the resultant at a temperature higher than the melting point of Sn to cause Cu and Sn of the joint material to undergo transitional liquid phase sintering, to thereby set the joint material to a composition containing $Cu_6Sn_5$ and $Cu_3Sn$; and heating the resultant to change $Cu_6Sn_5$ of the joint material to $Cu_3Sn$, to thereby increase the ratio of $Cu_3Sn$.

CITATION LIST

Patent Document

Patent Document 1: JP 2014-199852 A

SUMMARY OF THE INVENTION

Technical Problem

However, in Patent Document 1, no consideration is given to the influence of the composition ratio of the Cu particles and the Sn particles on the crack resistance of a joint portion. The fluidity of Sn is decreased when a large amount of the Cu particles are added, and hence it is conceived that voids are generated in portions sealed with the particles. When a thermal shock is applied to the joint portion including the voids, cracks are liable to occur. Further, a Cu—Sn alloy typified by $Cu_6Sn_5$ exhibits a two-phase separation type state, though there is a solid solution region of about 5 mass % of Cu in view of a metal phase diagram. Therefore, unless Sn having a low melting point is present at the interface of $Cu_6Sn_5$, voids are formed and may serve as starting points of cracks. Therefore, it cannot be said that the crack resistance of the joint portion formed by the joining method of Patent Document 1 is sufficient.

The present invention has been made to solve the above-mentioned problems, and an object of the present invention is to provide a joint structure having high joining reliability, such as difficulty in occurrence of cracks even during high-temperature operation of the semiconductor device. In addition, another object of the present invention is to provide a semiconductor device including the joint structure and a method of manufacturing therefor.

Solution to the Problem

According to one embodiment of the present invention, there is provided a joint structure interposed between a semiconductor element and a substrate, the joint structure including: a Sn phase; Cu alloy particles containing P in an amount of 1 mass % or more and less than 7 mass %; and Ag particles, wherein the Cu alloy particles are each coated with a $Cu_6Sn_5$ coating layer, wherein the Ag particles are each coated with a $Ag_3Sn$ coating layer, wherein the Cu alloy particles and the Ag particles are at least partially bonded to each other through a $Cu_{10}Sn_3$ phase, wherein a total of addition amounts of the Cu alloy particles and the Ag particles is 25 mass % or more and less than 65 mass % with respect to the joint structure, and wherein a mass ratio of the addition amount of the Ag particles to the addition amount of the Cu alloy particles is 0.2 or more and less than 1.2.

According to one embodiment of the present invention, there is provided a semiconductor device, including: a semiconductor element; and a substrate, the semiconductor element and the substrate being joined to each other through intermediation of the above-mentioned joint structure.

According to one embodiment of the present invention, there is provided a method of manufacturing a semiconductor device, including the steps of: preparing a paste by mixing Sn particles, Cu alloy particles containing P in an amount of 1 mass % or more and less than 7 mass %, Ag particles, and a solvent, a total amount of the Cu alloy particles and the Ag particles being set to 25 mass % or more and less than 65 mass % with respect to a total amount of the Sn particles, the Cu alloy particles, and the Ag particles, a mass ratio of the Ag particles to the Cu alloy particles being set to 0.2 or more and less than 1.2; applying the paste onto a substrate; placing a semiconductor element on the paste; volatilizing the solvent in the paste by heating to a temperature of 120° C. or more and 200° C. or less; and joining the semiconductor element and the substrate to each other by heating to a temperature of 340° C. or more and less than 450° C.

Advantageous Effects of the Invention

According to the present invention, the joint structure having high joining reliability, such as difficulty in occurrence of cracks even during high-temperature operation of the semiconductor device, can be provided. According to the present invention, the semiconductor device including the joint structure having high joining reliability and the manufacturing method therefor can also be provided.

DESCRIPTION OF THE EMBODIMENTS

First Embodiment

Figure 1:
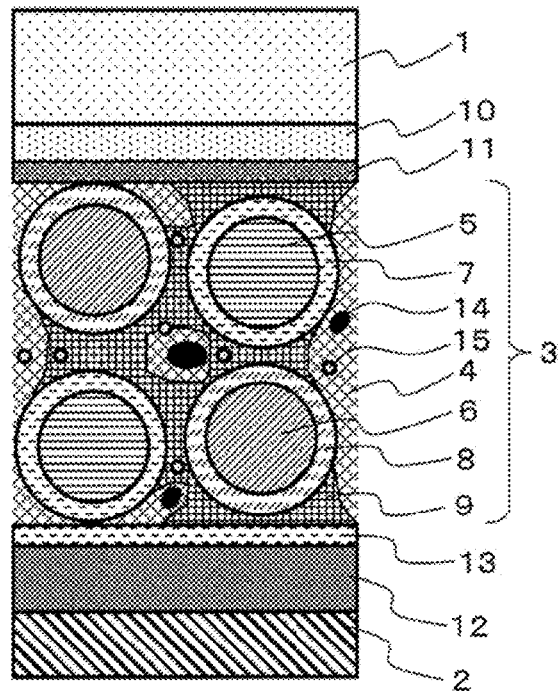
FIG. 1 is a schematic sectional view of a semiconductor device including a joint structure according to a first embodiment.

FIG. 1 is a schematic sectional view of a semiconductor device including a joint structure according to a first embodiment of the present invention. In FIG. 1, the semiconductor device has a configuration in which a semiconductor element 1 and a substrate 2 are joined to each other through intermediation of a joint structure 3. The joint structure 3 includes a tin (Sn) phase 4, copper (Cu) alloy particles 5 containing phosphorus (P) in an amount of 1 mass % or more and less than 7 mass %, and silver (Ag) particles 6. The surface of each of the Cu alloy particles 5 is coated with a $Cu_6Sn_5$ coating layer 7. The surface of each of the Ag particles 6 is coated with a $Ag_3Sn$ coating layer 8. The Cu alloy particles 5 and the Ag particles 6 are at least partially bonded to each other through a $Cu_{10}Sn_3$ phase 9. A Ag layer 10 and a $Ag_3Sn$ interface layer 11 are formed between the semiconductor element 1 and the joint structure 3 in the stated order from the semiconductor element 1 side. A Cu layer 12 and a $Cu_6Sn_5$ interface layer 13 are formed between the substrate 2 and the joint structure 3 in the stated order from the substrate 2 side. In addition, in the joint structure 3, voids 14 generated during a manufacturing process of the semiconductor device are present. Further, in the joint structure 3, fine Cu—P compound particles 15 generated during the manufacturing process of the semiconductor device may be spread in a dotted manner.

In the joint structure 3 according to the first embodiment, the total of addition amounts of the Cu alloy particles 5 and the Ag particles 6 is 25 mass % or more and less than 65 mass %, preferably 30 mass % or more and 60 mass % or less with respect to the joint structure 3. When the total of addition amounts of the Cu alloy particles 5 and the Ag particles 6 is less than 25 mass %, Sn is insufficient for the Cu alloy particles 5 and the Ag particles 6, and a low melting point phase is observed in the joint structure 3. On the other hand, when the total of addition amounts of the Cu alloy particles 5 and the Ag particles 6 is 65 mass % or more, a large number of voids are generated in the joint structure 3, and cracks are liable to occur.

In the joint structure 3 according to the first embodiment, the mass ratio (Ag/Cu mass ratio) of the addition amount of the Ag particles 6 to the addition amount of the Cu alloy particles 5 is 0.2 or more and less than 1.2, preferably 0.3 or more and 1.1 or less. When the Ag/Cu mass ratio is less than 0.2 or 1.2 or more, a large number of voids are generated in the joint structure 3, and cracks are liable to occur.

The sectional thickness of the joint structure 3 is preferably 20 μm or more and 150 μm or less, more preferably 30 μm or more and 130 μm or less. When the sectional thickness of the joint structure 3 falls within the above-mentioned ranges, the joint structure 3 has few voids, and can have excellent crack resistance.

When the phosphorus content of the Cu alloy particles 5 is less than 1 mass % or 7 mass % or more, a large number of voids are generated in the joint structure 3, and cracks are liable to occur. The phosphorus content of the Cu alloy particles 5 is preferably 2 mass % or more and 6 mass % or less. The shape of the Cu alloy particles 5 is not particularly limited, but is preferably spherical. The average particle diameter of the Cu alloy particles 5 is preferably 5 μm or more and 50 μm or less, more preferably 7 μm or more and 40 μm or less. When the average particle diameter of the Cu alloy particles 5 falls within the above-mentioned ranges, a solvent easily comes out from gaps between the Cu alloy particles 5, the Ag particles 6, and the Sn particles, and an oxide film on the surface of each of the Cu alloy particles 5 is easily removed with the solvent. Therefore, a compound can be formed with Sn. In addition, the thickness of the $Cu_6Sn_5$ coating layer 7 with which the surface of each of the Cu alloy particles 5 is coated is not particularly limited, but is preferably 3 μm or more and 20 μm or less.

The shape of the Ag particles 6 is not particularly limited, but is preferably spherical. The average particle diameter of the Ag particles 6 is preferably 5 μm or more and 50 μm or less, more preferably 7 μm or more and 40 μm or less. When the average particle diameter of the Ag particles 6 falls within the above-mentioned ranges, a solvent easily comes out from gaps between the Cu alloy particles 5, the Ag particles 6, and the Sn particles, and an oxide film on the surface of each of the Ag particles 6 is easily removed with the solvent. Therefore, a compound can be formed with Sn. The thickness of the $Ag_3Sn$ coating layer 8 with which the surface of each of the Ag particles 6 is coated is not particularly limited, but is preferably 5 μm or more and 30 μm or less.

As used herein, the average particle diameter is a value measured through use of an apparatus based on a particle diameter analysis-laser diffraction/scattering method described in JIS-Z-8825.

The thickness of the $Ag_3Sn$ interface layer 11 is not particularly limited, but is preferably 5 μm or more and 30 μm or less.

The thickness of the $Cu_6Sn_5$ interface layer 13 is not particularly limited, but is preferably 3 μm or more and 20 μm or less.

As used herein, the thickness of each of the $Cu_6Sn_5$ coating layer 7, the $Ag_3Sn$ coating layer 8, the $Ag_3Sn$ interface layer 11, and the $Cu_6Sn_5$ interface layer 13 is a value obtained by measuring a cross-section of a joint portion through use of a scanning electron microscope (SEM) apparatus.

The semiconductor element 1 may be a general semiconductor element made of silicon (Si) as a base material, but is preferably a wide bandgap semiconductor element made of a wide bandgap semiconductor material, such as silicon carbide (SiC), a gallium nitride (GaN)-based material, or diamond, which has a bandgap wider than that of silicon. The Ag layer 10 is formed on the semiconductor element 1 in order to secure a joining property with the joint structure 3. The thickness of the Ag layer 10 is not particularly limited as long as the joining property with the joint structure 3 can be secured.

Examples of a material for the substrate 2 include silicon nitride ($Si_3N_4$), aluminum nitride (AlN), and a copper molybdenum alloy. The Cu layer 12 is formed on the substrate 2 in order to secure a joining property with the joint structure 3. The thickness of the Cu layer 12 is not particularly limited as long as the joining property with the joint structure 3 can be secured. In addition, it is only required that the Cu layer 12 contain Cu as a main ingredient, and the Cu layer 12 may contain a Cu alloy, such as Cu—Mo, Cu—Cr, Cu—W, Cu—P, Cu—Sn, or Cu—Zn.

Figure 2:
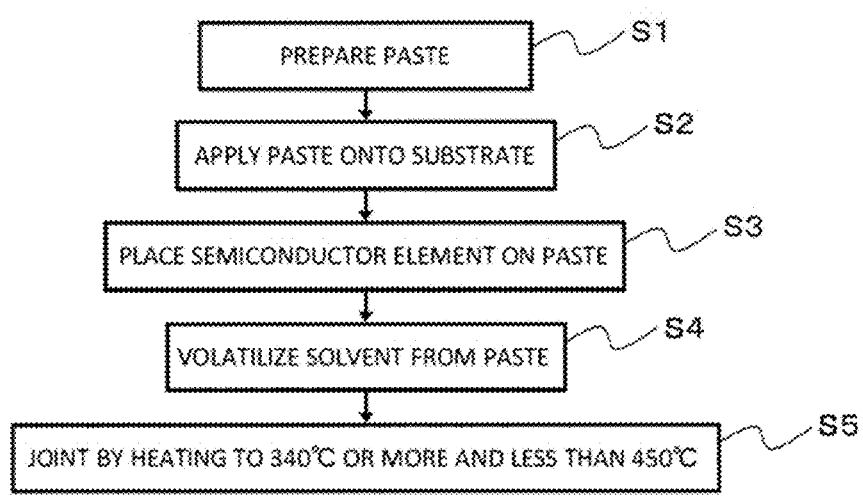
FIG. 2 is a flowchart of a method of manufacturing a semiconductor device including a joint structure according to the first embodiment.

Next, a method of manufacturing a semiconductor device including a joint structure according to the first embodiment is described. FIG. 2 is a flowchart of the method of manufacturing a semiconductor device including a joint structure according to the first embodiment.

Figure 3:
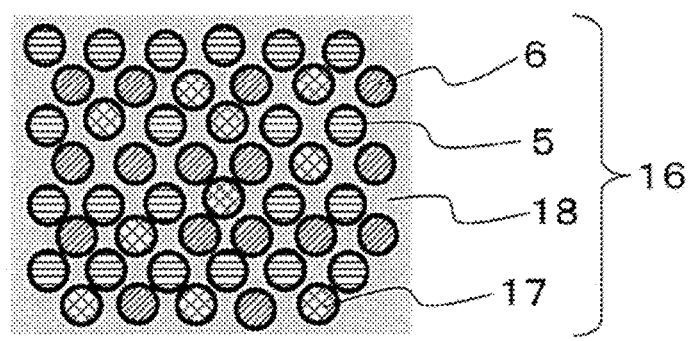
FIG. 3 is a schematic view for illustrating a state of ingredients contained in a paste.

First, Sn particles, Cu alloy particles containing P in an amount of 1 mass % or more and less than 7 mass %, Ag particles, and a solvent are mixed to prepare a paste (S1). FIG. 3 is a schematic view for illustrating the state of the ingredients contained in the paste. As illustrated in FIG. 3, in a paste 16, Sn particles 17, the Cu alloy particles 5, and the Ag particles 6 are in a state of being dispersed in a solvent 18. A method of producing the Sn particles 17, the Cu alloy particles 5, and the Ag particles 6 used herein is not particularly limited, and a known method, such as an atomizing method, may be used. As the solvent 18, a solvent used for a known joint material paste may be used, and examples thereof include terpineol, diethylene glycol monobutyl ether, methyl ethyl ketone, and isophorone. The solvent 18 is contained in the paste 16 preferably within a range of 10 mass % or more and 30 mass % or less. The total amount of the Cu alloy particles 5 and the Ag particles 6 contained in the paste 16 is 25 mass % or more and less than 65 mass %, preferably 30 mass % or more and 60 mass % or less with respect to the total amount of the Sn particles 17, the Cu alloy particles 5, and the Ag particles 6. When the total amount of the Cu alloy particles 5 and the Ag particles 6 is less than 25 mass %, Sn is insufficient for the Cu alloy particles 5 and the Ag particles 6, and a low melting point phase is observed in the joint structure 3. On the other hand, when the total amount of the Cu alloy particles 5 and the Ag particles 6 is 65 mass % or more, a large number of voids are generated in the joint structure 3, and cracks are liable to occur. The mass ratio (Ag/Cu mass ratio) of the Ag particles 6 contained in the paste 16 to the Cu alloy particles 5 contained therein is 0.2 or more and less than 1.2, preferably 0.3 or more and 1.1 or less. When the Ag/Cu mass ratio is less than 0.2 or 1.2 or more, a large number of voids are generated in the joint structure 3, and cracks are liable to occur.

Figure 4:
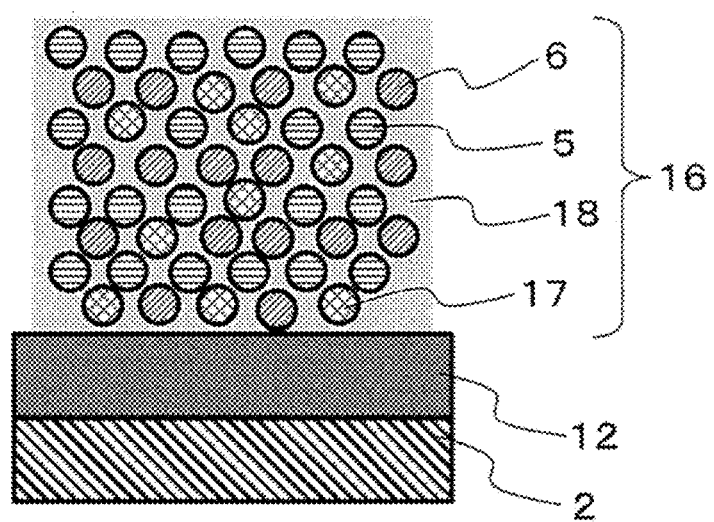
FIG. 4 is a schematic view for illustrating the step of applying the paste onto a substrate in the method of manufacturing a semiconductor device according to the first embodiment.

Next, as illustrated in FIG. 4, the prepared paste 16 is applied onto the Cu layer 12 of the substrate 2 (S2). It is only required that the application thickness of the paste 16 be appropriately adjusted so that the joint structure 3 has a desired sectional thickness. The method of applying the paste 16 is not particularly limited as long as the paste 16 can be applied uniformly with a desired application thickness, and examples thereof include an application method using a squeegee and an application method using a dispenser.

Figure 5:
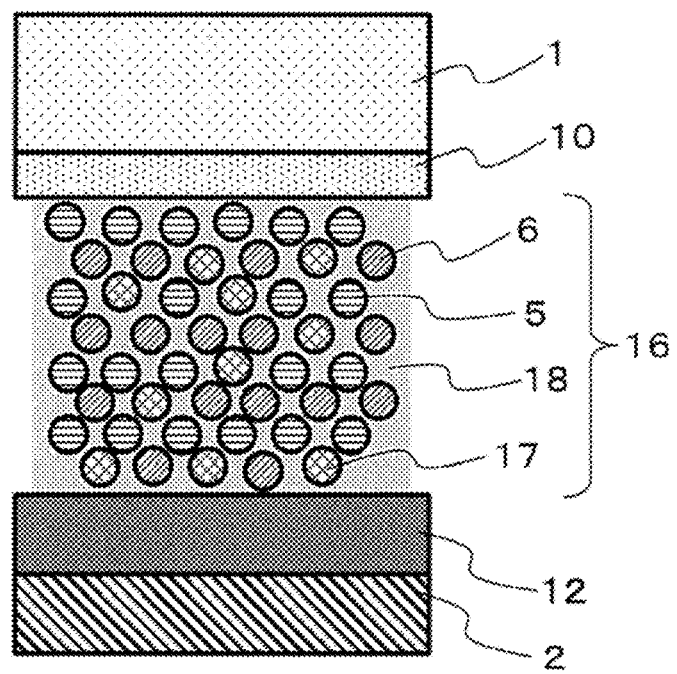
FIG. 5 is a schematic view for illustrating the step of placing a semiconductor element on the paste applied onto the substrate in the method of manufacturing a semiconductor device according to the first embodiment.

Next, as illustrated in FIG. 5, the semiconductor element 1 is placed on the paste 16 applied onto the Cu layer 12 of the substrate 2 so that the Ag layer 10 of the semiconductor element 1 is brought into contact with the paste 16 (S3). In order to place the semiconductor element 1 on the paste 16 with high accuracy, an apparatus capable of automatically recognizing the upper surface of the paste 16, for example, a chip mounter manufactured by Athlete FA Corporation may be used.

Figure 6:
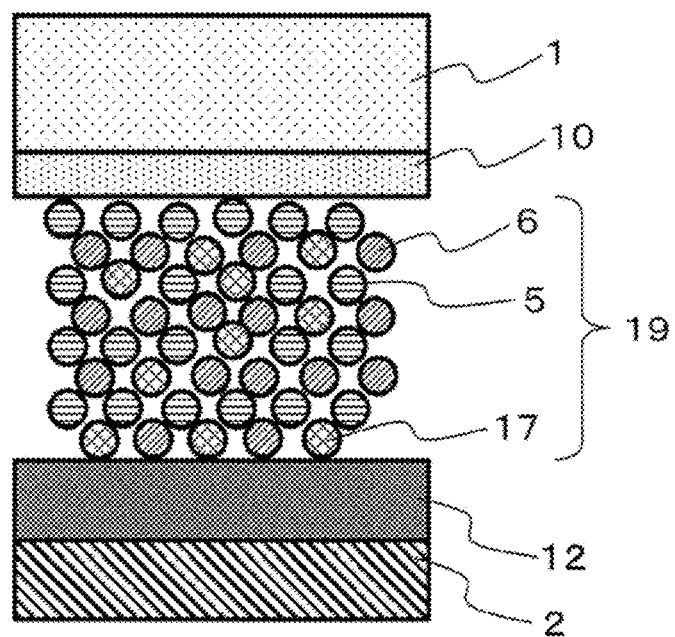
FIG. 6 is a schematic view for illustrating the step of volatilizing a solvent in the paste by heating in the method of manufacturing a semiconductor device according to the first embodiment.

Next, as illustrated in FIG. 6, a laminate including the semiconductor element 1, the paste 16, and the substrate 2 is heated to a temperature of 120° C. or more and 200° C. or less to volatilize the solvent 18, to thereby remove the solvent 18 from the paste 16 (S4). An obtained paste dried body 19 is formed of the Sn particles 17, the Cu alloy particles 5, and the Ag particles 6. The heating may be performed under any atmosphere, such as a vacuum atmosphere, an atmospheric atmosphere, or an inert gas atmosphere, but it is required to perform the heating so that the Sn particles 17 are not melted. It is only required that the heating temperature be appropriately set within a range of 120° C. or more and 200° C. or less depending on the boiling point of the solvent 18.

Figure 7:
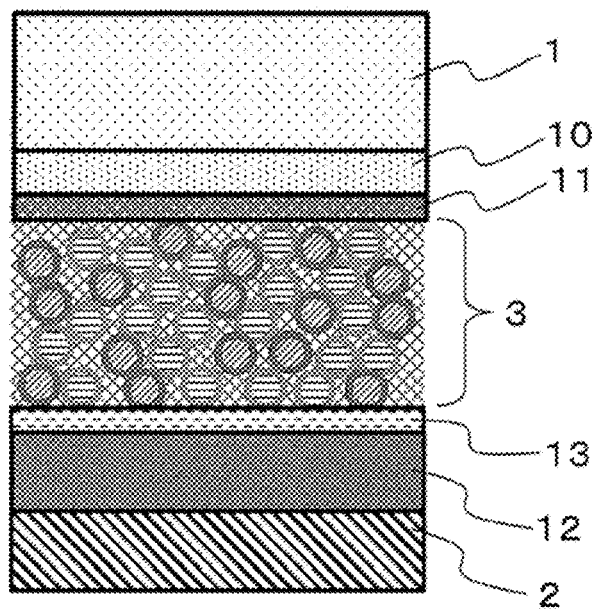
FIG. 7 is a schematic view for illustrating the step of joining the semiconductor element and the substrate to each other by heating in the method of manufacturing a semiconductor device according to the first embodiment.

Finally, as illustrated in FIG. 7, the laminate including the semiconductor element 1, the paste dried body 19, and the substrate 2 is heated to a temperature of 340° C. or more and less than 450° C. to join the semiconductor element 1 and the substrate 2 to each other through intermediation of the joint structure 3 (S5). In this step, the Sn particles 17 are melted when the heating temperature reaches 232° C. When the Sn particles 17 are melted, the $Ag_3Sn$ interface layer 11 is formed at the interface with the Ag layer 10 of the semiconductor element 1, and the $Cu_6Sn_5$ interface layer 13 is formed at the interface with the Cu layer 12 of the substrate 2. Simultaneously, the $Cu_6Sn_5$ coating layer 7 is formed so as to cover the surface of each of the Cu alloy particles 5, and the $Ag_3Sn$ coating layer 8 is formed so as to cover the surface of each of the Ag particles 6. Dissolved oxygen is present in the Cu alloy particles 5 in no small measure. This oxygen deteriorates the joining property. However, when the $Cu_6Sn_5$ coating layer 7 is formed, P contained in the Cu alloy particles 5 acts as a deoxidizing agent and preferentially reacts with oxygen to form a phosphorus oxide. This phosphorus oxide is vaporized when the heating temperature reaches 270° C. A part of P contained in the Cu alloy particles 5 may not react with oxygen and may be precipitated in the joint structure 3 as the fine Cu—P compound particles 15. When the P content of the Cu alloy particles 5 is 1 mass % or more and less than 7 mass %, the joining reliability is not adversely influenced. After that, when the heating temperature reaches 340° C. or more and less than 450° C., phase transformation occurs between the $Cu_6Sn_5$ coating layer 7 and the $Ag_3Sn$ coating layer 8 to form the $Cu_{10}Sn_3$ phase 9. The Cu alloy particles 5 and the Ag particles 6 are at least partially bonded to each other through the $Cu_{10}Sn_3$ phase 9, and hence the voids 14 serving as the starting points of cracks are reduced. As a result, cracks are less liable to occur in the joint structure 3 even when the semiconductor device is operated at high temperature.

In the semiconductor device including the joint structure 3 manufactured as described above, cracks are less liable to occur even during high-temperature operation, and the semiconductor device has high reliability.

In the foregoing, the mode of joining the semiconductor element and the substrate to each other has been described, but the present invention is not limited thereto. For example, the present invention may apply also to a mode of joining the semiconductor element and a lead frame to each other, a mode of joining the substrate and cooling fins to each other, and the like. In addition, the present invention is not limited to the case in which one semiconductor element and one substrate are joined to each other, and a plurality of semiconductor elements and members may be arranged on one substrate and joined to each other at a time.

EXAMPLES

Example 1

Sn particles having an average particle diameter of 20 μm, Cu alloy particles having a P content of 5 mass % and an average particle diameter of 20 μm, Ag particles, and terpineol serving as a solvent were mixed with each other to prepare a paste. In this case, the total amount of the Cu alloy particles and the Ag particles was set to 50 mass % with respect to the total amount of the Sn particles, the Cu alloy particles, and the Ag particles, and a Ag/Cu mass ratio was set to 0.67 (the number was rounded off to the second decimal place). In addition, the amount of the solvent was set to 20 mass % with respect to the paste. The Sn particles, the Cu alloy particles and the Ag particles used herein were produced by an atomizing method, and the shapes thereof were all spherical.

A stainless-steel metal mask having an opening size of 10 mm×10 mm was placed on a direct bonded copper (DBC) substrate having a size of 20 mm×20 mm. After that, the paste prepared in the foregoing was applied onto the resultant through use of a squeegee to a thickness of 150 μm. As the DBC substrate, a DBC substrate having a structure in which a Cu layer having a thickness of 0.4 mm was formed on each surface of ceramic ($Si_3N_4$) having a thickness of 0.6 mm was used.

On the paste applied onto the DBC substrate, a semiconductor element in which a Ag layer having a thickness of 7 μm was formed on one surface of silicon carbide (SiC) having a size of 10 mm×10 mm and a thickness of 0.3 mm was placed so that an upper surface of the paste and the Ag layer were brought into contact with each other.

Next, in a vacuum reflow furnace, a laminate including the DBC substrate, the paste, and the semiconductor element was heated to 180° C. to volatilize the terpineol in the paste.

Subsequently, in the vacuum reflow furnace, the laminate including the DBC substrate, the paste dried body, and the semiconductor element was heated to 340° C. at a temperature increase rate of 30° C./min, and then naturally cooled to obtain a semiconductor device.

In order to non-destructively inspect the generation status of voids in a joint structure of the obtained semiconductor device, a side surface of the joint structure was observed through use of an Scanning Acoustic Tomograph (SAT) (FineSAT III manufactured by Hitachi Power Solutions Co., Ltd.). The observed image was binarized through use of binarization software (Photoshop manufactured by Adobe Systems Incorporated) to calculate a percentage void. Those having a percentage void of less than 10% were evaluated as having a satisfactory initial joining property (○), and those having a percentage void of 10% or more were evaluated as having an unsatisfactory initial joining property (x). The results are shown in Table 1.

Examples 2 to 4 and Comparative Examples 1 to 3

Each semiconductor device was obtained in the same manner as in Example 1 except that the joining temperature was changed to those shown in Table 1. The generation status of voids in the joint structure of the obtained semiconductor device was evaluated in the same manner as in Example 1. The results are shown in Table 1.

TABLE 1

| | Joining temperature | Percentage void | Initial joining property | Presence or absence of $Cu_{10}Sn_3$ phase |
|---|---|---|---|---|
| Comparative Example 1 | 300° C. | 50% | x | Absent |
| Comparative Example 2 | 330° C. | 40% | x | Absent |
| Example 1 | 340° C. | 8% | ○ | Present |
| Example 2 | 380° C. | 6% | ○ | Present |
| Example 3 | 400° C. | 5% | ○ | Present |
| Example 4 | 440° C. | 7% | ○ | Present |
| Comparative Example 3 | 450° C. | 52% | x | Absent |

Figure 8:
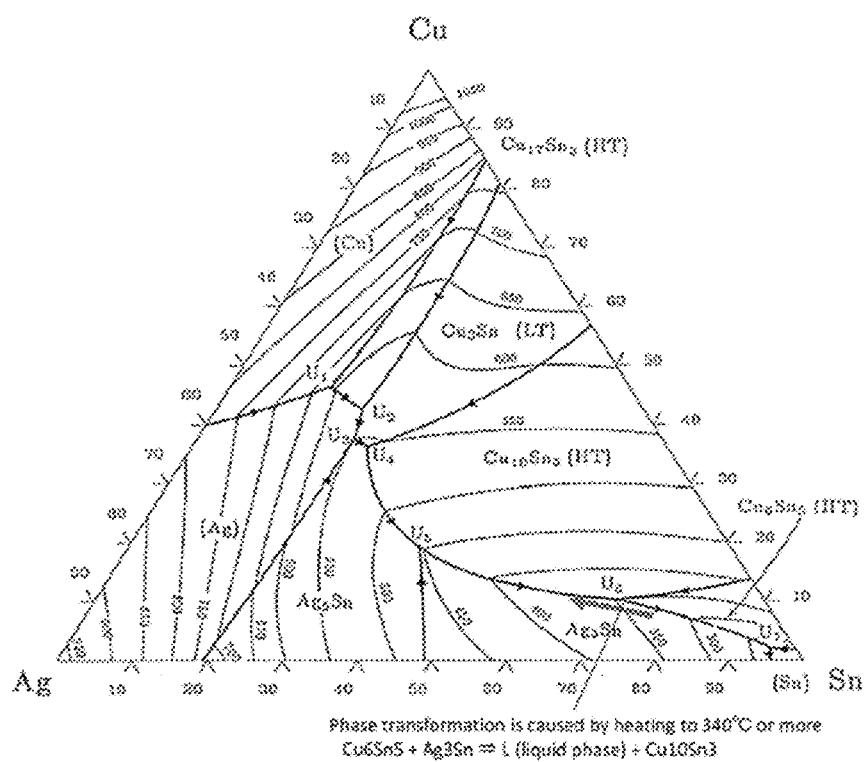
FIG. 8 is a ternary phase diagram of Ag—Sn—Cu.

As is understood from Table 1, when the joining temperature was less than 340° C., the initial joining property was unsatisfactory. The reason for this is conceived as follows. When a $Cu_6Sn_5$ coating layer, a $Ag_3Sn$ coating layer, a $Cu_6Sn_5$ interface layer, and a $Ag_3Sn$ interface layer were formed along with the heating, volume contraction of about 10% occurred to form voids. When the joining temperature was 340° C. or more and less than 450° C., the voids were abruptly reduced, and the initial joining property was satisfactory. When the composition of a cross-section of each of those joint structures was analyzed, a $Cu_{10}Sn_3$ phase was formed between the $Cu_6Sn_5$ coating layer and the $Ag_3Sn$ coating layer. The reason for this is conceived as follows. When the joining temperature was 340° C. or more, phase transformation occurred between the $Cu_6Sn_5$ coating layer and the $Ag_3Sn$ coating layer, and the $Cu_{10}Sn_3$ phase and a Sn-rich molten phase (Sn—Cu—Ag eutectic phase) were formed. The mechanism by which the $Cu_{10}Sn_3$ phase is formed can be read also from a ternary phase diagram of Ag—Sn—Cu shown in FIG. 8. When the joining temperature was 450° C., the initial joining property was unsatisfactory. When the composition of a cross-section of this joint structure was analyzed, no $Cu_{10}Sn_3$ phase was observed. The reason for this is conceived as follows. A $Cu_3Sn$ coating layer was formed on the surface of each of the Cu alloy particles instead of the $Cu_6Sn_5$ coating layer, and the above-mentioned phase transformation did not occur.

Examples 5 to 13 and Comparative Examples 4 to 22

Each semiconductor device was obtained in the same manner as in Example 1 except that the total amount of the Cu alloy particles and the Ag particles and the Ag/Cu mass ratio were changed as shown in Tables 2 and 3, and the joining temperature was changed to 400° C.

A joint structure was cut out from the obtained semiconductor device and heated to 300° C. by differential scanning calorimetry (DSC). Thus, it was determined whether or not a melting peak with a melting point of from 210° C. to 240° C. derived from the Sn phase occurred. Those having a melting peak detected were evaluated as having a low melting point phase, and those having no melting peak detected were evaluated as having no low melting point phase. Specifically, when the joint structure was heated from room temperature to 300° C. at a temperature increase rate of 10° C./min in the atmosphere, and the melting peak amount up to a temperature of from 210° C. to 240° C. was less than 20 mJ/mg, it was determined that there was no low melting point phase. When the melting peak amount was 20 mJ/mg or more, it was determined that there was a low melting point phase. The results are shown in Tables 2 and 3.

The generation status of voids in the joint structure of the obtained semiconductor device was evaluated in the same manner as in Example 1. The results are shown in Tables 2 and 3.

In addition, the initial thermal resistance value of the semiconductor device was measured by a laser flash method. Next, as simulation of high-temperature operation of the semiconductor device, the semiconductor device was held at 175° C. for 30 seconds after being held at 50° C. for 30 seconds as one cycle with a liquid tank type heat shock tester, and this operation was performed for 100,000 cycles. A thermal resistance value after 100,000 cycles was measured, and a change rate with respect to the initial thermal resistance value was calculated in accordance with the following expression. The results are shown in Tables 2 and 3. When the change rate of the thermal resistance value is 10% or more, it can be determined that the crack resistance of the semiconductor device during high-temperature operation is unsatisfactory.

Change rate (%) of thermal resistance value=(initial thermal resistance value−thermal resistance value after 100,000 cycles)/initial thermal resistance value×100

TABLE 2

| | Ag particles (mass %) | Cu alloy particles (mass %) | Sn particles (mass %) | Cu alloy particles + Ag particles (mass %) | Ag/Cu mass ratio | P content (mass %) in Cu alloy particles | Presence or absence of low melting point phase | Initial joining property | Change rate (%) of thermal resistance value |
|---|---|---|---|---|---|---|---|---|---|
| Example 5 | 10.0 | 15.0 | 75 | 25 | 0.67 | 5 | Absent | ○ | 7 |
| Example 6 | 20.1 | 29.9 | 50 | 50 | 0.67 | 5 | Absent | ○ | 6 |
| Example 7 | 25.3 | 37.7 | 37 | 63 | 0.67 | 5 | Absent | ○ | 6 |
| Example 8 | 4.2 | 20.8 | 75 | 25 | 0.20 | 5 | Absent | ○ | 8 |
| Example 9 | 8.3 | 41.7 | 50 | 50 | 0.20 | 5 | Absent | ○ | 7 |
| Example 10 | 10.5 | 52.5 | 37 | 63 | 0.20 | 5 | Absent | ○ | 7 |
| Example 11 | 13.1 | 11.9 | 75 | 25 | 1.10 | 5 | Absent | ○ | 9 |
| Example 12 | 26.2 | 23.8 | 50 | 50 | 1.10 | 5 | Absent | ○ | 8 |
| Example 13 | 33.0 | 30.0 | 37 | 63 | 1.10 | 5 | Absent | ○ | 8 |

TABLE 3

| | Ag particles (mass %) | Cu alloy particles (mass %) | Sn particles (mass %) | Cu alloy particles + Ag particles (mass %) | Ag/Cu mass ratio | P content (mass %) in Cu alloy particles | Presence or absence of low melting point phase | Initial joining property | Change rate (%) of thermal resistance value |
|---|---|---|---|---|---|---|---|---|---|
| Comparative Example 4 | 2.0 | 3.0 | 95 | 5 | 0.67 | 5 | Present | ○ | 35 |
| Comparative Example 5 | 4.0 | 6.0 | 90 | 10 | 0.67 | 5 | Present | ○ | 33 |
| Comparative Example 6 | 9.2 | 13.8 | 77 | 23 | 0.67 | 5 | Present | ○ | 20 |
| Comparative Example 7 | 26.1 | 38.9 | 35 | 65 | 0.67 | 5 | Absent | x | 18 |
| Comparative Example 8 | 28 | 42 | 30 | 70 | 0.67 | 5 | Absent | x | 24 |

TABLE 3-continued

|  | Ag particles (mass %) | Cu alloy particles (mass %) | Sn particles (mass %) | Cu alloy particles + Ag particles (mass %) | Ag/Cu mass ratio | P content (mass %) in Cu alloy particles | Presence or absence of low melting point phase | Initial joining property | Change rate (%) of thermal resistance value |
|---|---|---|---|---|---|---|---|---|---|
| Comparative Example 9 | 3.3 | 19.7 | 77 | 23 | 0.17 | 5 | Present | x | 40 |
| Comparative Example 10 | 3.6 | 21.4 | 75 | 25 | 0.17 | 5 | Absent | x | 38 |
| Comparative Example 11 | 7.3 | 42.7 | 50 | 50 | 0.17 | 5 | Absent | x | 34 |
| Comparative Example 12 | 9.2 | 53.8 | 37 | 63 | 0.17 | 5 | Absent | x | 28 |
| Comparative Example 13 | 9.4 | 55.6 | 35 | 65 | 0.17 | 5 | Absent | x | 32 |
| Comparative Example 14 | 3.8 | 19.2 | 77 | 23 | 0.20 | 5 | Present | ○ | 23 |
| Comparative Example 15 | 10.8 | 54.2 | 35 | 65 | 0.20 | 5 | Absent | x | 18 |
| Comparative Example 16 | 12.0 | 11.0 | 77 | 23 | 1.10 | 5 | Present | ○ | 24 |
| Comparative Example 17 | 34.0 | 31.0 | 35 | 65 | 1.10 | 5 | Absent | x | 20 |
| Comparative Example 18 | 12.5 | 10.5 | 77 | 23 | 1.20 | 5 | Present | x | 24 |
| Comparative Example 19 | 13.6 | 11.4 | 75 | 25 | 1.20 | 5 | Absent | x | 17 |
| Comparative Example 20 | 27.3 | 22.7 | 50 | 50 | 1.20 | 5 | Absent | x | 18 |
| Comparative Example 21 | 34.4 | 28.6 | 37 | 63 | 1.20 | 5 | Absent | x | 20 |
| Comparative Example 22 | 35.5 | 29.5 | 35 | 65 | 1.20 | 5 | Absent | x | 40 |

As is understood from Table 2, in the case where the Cu alloy particles containing 5 mass % of P were used, when the total amount of the Cu alloy particles and the Ag particles was set to 25 mass % or more and less than 65 mass % and the Ag/Cu mass ratio was set to 0.2 or more and less than 1.2, there was obtained a semiconductor device in which a low melting point phase was not observed in the joint structure, and which had a satisfactory initial joining property and crack resistance. On the other hand, as is understood from Table 3, even in the case where the Cu alloy particles containing 5 mass % of P were used, when the total amount of the Cu alloy particles and the Ag particles was set to less than 25 mass % or 65 mass % or more, or when the Ag/Cu mass ratio was set to less than 0.2 or 1.2 or more, a low melting point phase was observed in the joint structure and the initial joining property was unsatisfactory, and in addition, the crack resistance was unsatisfactory in any case.

Examples 14 to 19 and Comparative Examples 23 to 36

Each semiconductor device was obtained in the same manner as in Example 1 except that the total amount of the Cu alloy particles and the Ag particles and the P content in the Cu alloy particles were changed as shown in Tables 4 and 5, and the joining temperature was changed to 400° C.

The presence or absence of the low melting point phase and the generation status of voids in the joint structure, and the change rate of the thermal resistance value of the obtained semiconductor device were evaluated in the same manner as in Example 5. The results are shown in Tables 4 and 5.

TABLE 4

|  | Ag particles (mass %) | Cu alloy particles (mass %) | Sn particles (mass %) | Cu alloy particles + Ag particles (mass %) | Ag/Cu mass ratio | P content (mass %) in Cu alloy particles | Presence or absence of low melting point phase | Initial joining property | Change rate (%) of thermal resistance value |
|---|---|---|---|---|---|---|---|---|---|
| Example 14 | 10.0 | 15.0 | 75 | 25 | 0.67 | 1 | Absent | ○ | 9 |
| Example 15 | 20.1 | 29.9 | 50 | 50 | 0.67 | 1 | Absent | ○ | 8 |
| Example 16 | 25.3 | 37.7 | 37 | 63 | 0.67 | 1 | Absent | ○ | 8 |
| Example 17 | 10.0 | 15.0 | 75 | 25 | 0.67 | 6.5 | Absent | ○ | 8 |
| Example 18 | 20.1 | 29.9 | 50 | 50 | 0.67 | 6.5 | Absent | ○ | 7 |
| Example 19 | 25.3 | 37.7 | 37 | 63 | 0.67 | 6.5 | Absent | ○ | 9 |

TABLE 5

| | Ag particles (mass %) | Cu alloy particles (mass %) | Sn particles (mass %) | Cu alloy particles + Ag particles (mass %) | Ag/Cu mass ratio | P content (mass %) in Cu alloy particles | Presence or absence of low melting point phase | Initial joining property | Change rate (%) of thermal resistance value |
|---|---|---|---|---|---|---|---|---|---|
| Comparative Example 23 | 9.2 | 13.8 | 77 | 23 | 0.67 | 0.8 | Present | x | 25 |
| Comparative Example 24 | 10.0 | 15.0 | 75 | 25 | 0.67 | 0.8 | Absent | x | 20 |
| Comparative Example 25 | 20.1 | 29.9 | 50 | 50 | 0.67 | 0.8 | Absent | x | 18 |
| Comparative Example 26 | 25.3 | 37.7 | 37 | 63 | 0.67 | 0.8 | Absent | x | 19 |
| Comparative Example 27 | 26.1 | 38.9 | 35 | 65 | 0.67 | 0.8 | Absent | x | 30 |
| Comparative Example 28 | 9.2 | 13.8 | 77 | 23 | 0.67 | 1 | Present | ○ | 22 |
| Comparative Example 29 | 26.1 | 38.9 | 35 | 65 | 0.67 | 1 | Absent | x | 24 |
| Comparative Example 30 | 9.2 | 13.8 | 77 | 23 | 0.67 | 6.5 | Present | ○ | 20 |
| Comparative Example 31 | 26.1 | 38.9 | 35 | 65 | 0.67 | 6.5 | Absent | x | 18 |
| Comparative Example 32 | 9.2 | 13.8 | 77 | 23 | 0.67 | 7 | Present | ○ | 25 |
| Comparative Example 33 | 10.0 | 15.0 | 75 | 25 | 0.67 | 7 | Absent | x | 17 |
| Comparative Example 34 | 20.1 | 29.9 | 50 | 50 | 0.67 | 7 | Absent | x | 19 |
| Comparative Example 35 | 25.3 | 37.7 | 37 | 63 | 0.67 | 7 | Absent | x | 21 |
| Comparative Example 36 | 26.1 | 38.9 | 35 | 65 | 0.67 | 7 | Absent | x | 28 |

As is understood from Table 4, even in the case where the Cu alloy particles containing 1 mass % or 6.5 mass % of P were used, when the total amount of the Cu alloy particles and the Ag particles was set to 25 mass % or more and less than 65 mass % and the Ag/Cu mass ratio was set to 0.2 or more and less than 1.2, there was obtained a semiconductor device in which a low melting point phase was not observed in the joint structure, and which had a satisfactory initial joining property and crack resistance. On the other hand, as is understood from Table 5, even in the case where the Ag/Cu mass ratio was set to 0.67, when the total amount of the Cu alloy particles and the Ag particles was set to less than 25 mass % or 65 mass % or more, or when the Cu alloy particles having a P content of less than 1 mass % or 7 mass % or more were used, a low melting point phase was observed in the joint structure and the initial joining property was unsatisfactory, and in addition, the crack resistance was unsatisfactory in any case.

Figure 9:
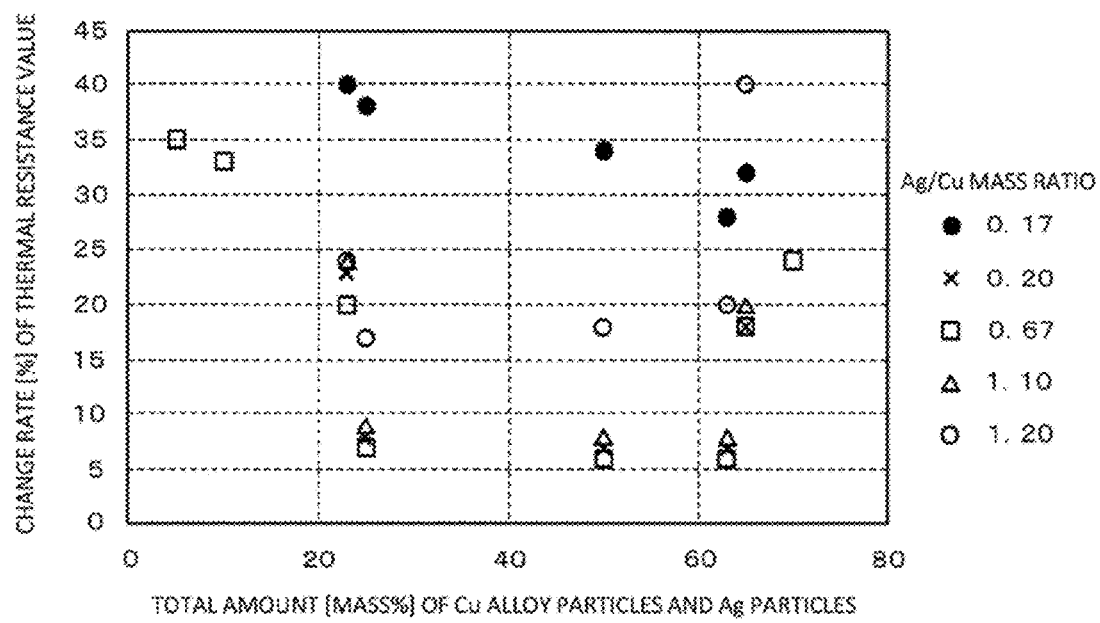
FIG. 9 is a graph showing a relationship between the total amount of Cu alloy particles and Ag particles and the change rate of a thermal resistance value in each Ag/Cu mass ratio.
Figure 10:
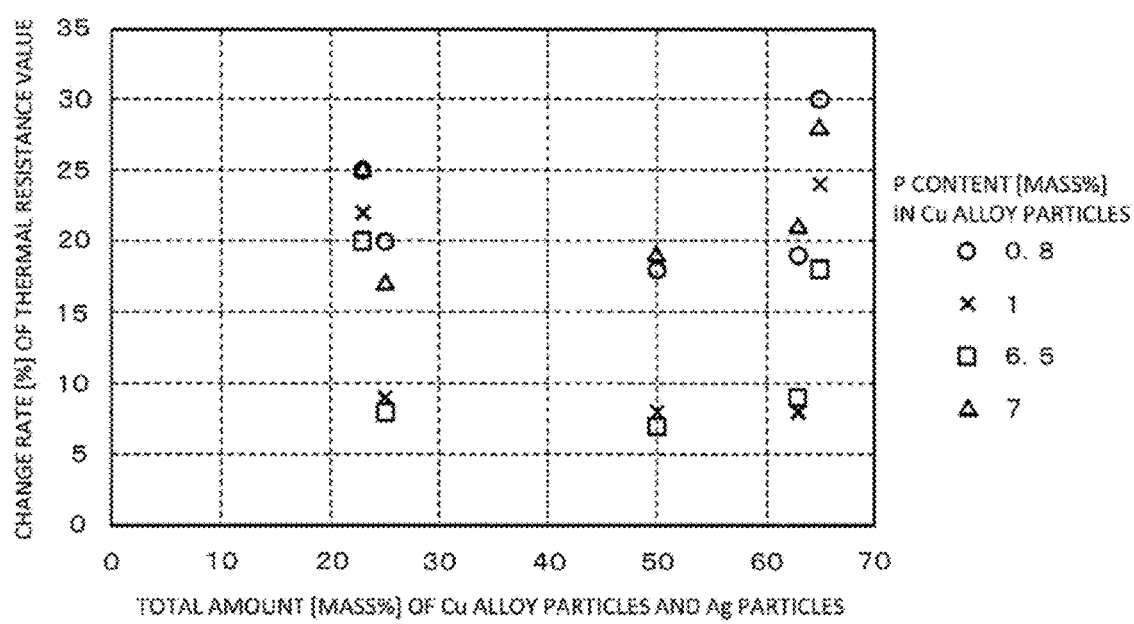
FIG. 10 is a graph showing a relationship between the total amount of Cu alloy particles and Ag particles and the change rate of a thermal resistance value in each P content in the Cu alloy particles.

Herein, in FIG. 9 there is shown a graph obtained by graphing each Ag/Cu mass ratio, with the vertical axis representing the change rate (%) of a thermal resistance value in Tables 2 and 3, and the horizontal axis representing the total (mass %) of addition amounts of the Cu alloy particles and the Ag particles with respect to the joint structure. In addition, in FIG. 10, there is shown a graph obtained by graphing each P content (mass %) in the Cu alloy particles, with the vertical axis representing the change rate (%) of a thermal resistance value in Tables 4 and 5, and the horizontal axis representing the total (mass %) of addition amounts of the Cu alloy particles and the Ag particles with respect to the joint structure. It was confirmed from FIG. 9 and FIG. 10 that, in the semiconductor device in which the Cu alloy particles containing P in an amount of 1 mass % or more and less than 7 mass % were used, the total of addition amounts of the Cu alloy particles and the Ag particles was set to 25 mass % or more and less than 65 mass % with respect to the joint structure, and the Ag/Cu mass ratio was set to 0.2 or more and less than 1.2, the change rate of the thermal resistance value was less than 10%.

EXPLANATION ON NUMERALS 1 semiconductor element
2 substrate
3 joint structure
4 Sn phase
5 Cu alloy particle
6 Ag particle
7 $Cu_6Sn_5$ coating layer
8 $Ag_3Sn$ coating layer
9 $Cu_{10}Sn_3$ phase
10 Ag layer
11 $Ag_3Sn$ interface layer
12 Cu layer
13 $Cu_6Sn_5$ interface layer
14 void
15 Cu—P compound particle
16 paste
17 Sn particle
18 solvent
19 paste dried body

The invention claimed is:

1. A joint structure interposed between a semiconductor element and a substrate,
the joint structure comprising:
a Sn phase;
Cu alloy particles containing P in an amount of 1 mass % or more and less than 7 mass %; and
Ag particles,
wherein the Cu alloy particles are each coated with a $Cu_6Sn_5$ coating layer,
wherein the Ag particles are each coated with a $Ag_3Sn$ coating layer,
wherein the Cu alloy particles and the Ag particles are at least partially bonded to each other through a $Cu_{10}Sn_3$ phase,
wherein a total of addition amounts of the Cu alloy particles and the Ag particles is 25 mass % or more and less than 65 mass % with respect to the joint structure, and
wherein a mass ratio of the addition amount of the Ag particles to the addition amount of the Cu alloy particles is 0.2 or more and less than 1.2.

2. The joint structure according to claim 1, wherein the joint structure has Cu—P compound particles spread in a dotted manner.

3. A semiconductor device, comprising:
a semiconductor element; and
a substrate,
the semiconductor element and the substrate being joined to each other through intermediation of the joint structure of claim 1.

4. The semiconductor device according to claim 3,
wherein the semiconductor device has a Ag layer and a Ag$_3$Sn interface layer formed between the semiconductor element and the joint structure in the stated order from a semiconductor element side, and
wherein the semiconductor device has a Cu layer and a Cu$_6$Sn$_5$ interface layer formed between the substrate and the joint structure in the stated order from a substrate side.

5. A method of manufacturing a semiconductor device, comprising the steps of:
preparing a paste by mixing Sn particles, Cu alloy particles containing P in an amount of 1 mass % or more and less than 7 mass %, Ag particles, and a solvent, a total amount of the Cu alloy particles and the Ag particles being set to 25 mass % or more and less than 65 mass % with respect to a total amount of the Sn particles, the Cu alloy particles, and the Ag particles, a mass ratio of the Ag particles to the Cu alloy particles being set to 0.2 or more and less than 1.2;
applying the paste onto a substrate;
placing a semiconductor element on the paste;
volatilizing the solvent in the paste by heating to a temperature of 120° C. or more and 200° C. or less; and
joining the semiconductor element and the substrate to each other by heating to a temperature of 340° C. or more and less than 450° C.

* * * * *